US008587351B1

(12) United States Patent
Crandall

(10) Patent No.: US 8,587,351 B1

(45) Date of Patent: Nov. 19, 2013

(54) METHOD FOR SYNCHRONIZING SAMPLING TO SINUSOIDAL INPUTS

(75) Inventor: Adam Crandall, Winnebago, IL (US)

(73) Assignee: Hamilton Sundstrand Corporation, Windsor Locks, CT (US)

(*) Notice: Subject to any disclaimer, the term of this patent is extended or adjusted under 35 U.S.C. 154(b) by 33 days.

(21) Appl. No.: 13/469,446

(22) Filed: May 11, 2012

(51) Int. Cl.
*H03L 7/06* (2006.01)

(52) U.S. Cl.
USPC ............................ 327/155; 327/146; 327/162

(58) Field of Classification Search
USPC .............. 327/141, 144–163; 331/1/A, 15–17; 375/373–376
See application file for complete search history.

(56) References Cited

U.S. PATENT DOCUMENTS

| | | | | |
|---|---|---|---|---|
| 4,893,066 | A | 1/1990 | Stewart et al. | |
| 4,893,261 | A | 1/1990 | Flint, III et al. | |
| 4,970,638 | A | 11/1990 | Yeh et al. | |
| 5,493,195 | A | 2/1996 | Heglund et al. | |
| 5,691,974 | A * | 11/1997 | Zehavi et al. | 370/203 |
| 6,211,633 | B1 | 4/2001 | Jones et al. | |
| 7,180,940 | B2 | 2/2007 | Li et al. | |
| 7,224,759 | B2 * | 5/2007 | White | 375/371 |
| 7,642,945 | B2 | 1/2010 | Tachibana et al. | |
| 7,696,741 | B2 | 4/2010 | Gurr | |
| 7,738,616 | B2 * | 6/2010 | Markman | 375/371 |
| 8,013,549 | B2 | 9/2011 | Keinhofer et al. | |
| 8,094,706 | B2 | 1/2012 | Kim et al. | |
| 2002/0057118 | A1 * | 5/2002 | Tang | 327/158 |
| 2004/0114701 | A1 * | 6/2004 | Markman | 375/371 |
| 2006/0067438 | A1 * | 3/2006 | Menkhoff et al. | 375/343 |
| 2012/0068748 | A1 * | 3/2012 | Stojanovic et al. | 327/161 |
| 2013/0120039 | A1 * | 5/2013 | Kerkman et al. | 327/156 |

* cited by examiner

*Primary Examiner* — Lincoln Donovan
*Assistant Examiner* — Brandon S Cole
(74) *Attorney, Agent, or Firm* — Carlson, Gaskey & Olds P.C.

(57) ABSTRACT

A method for synchronizing input sampling to desired phase angles of sinusoidal signals including determining a delay time period for converging a next sample point to a next desired phase angle based on a phase error value.

10 Claims, 2 Drawing Sheets

100
120
130
FILTER
132
170
COSINE EXPECTED Θ
110
160
150
CONTROL LOOP
140
138
SINE EXPECTED Θ
180
FILTER
122
134
136

METHOD FOR SYNCHRONIZING SAMPLING TO SINUSOIDAL INPUTS

TECHNICAL FIELD

The present disclosure is related to synchronizing sampling of sinusoidal signals, and more particularly to phase based synchronization with a variable time between samples.

BACKGROUND OF THE INVENTION

Electric controllers frequently sample sinusoidal or sinusoidally excited signals to determine characteristics of the sinusoidal signals, and use the determined characteristics to control a component. Various types of signal sampling are possible, including phase-locked loops, Costas loops, and similar carrier phase recover methods. Typical sampling methods rely on fixed, uniform, periods between sample points.

Often it is useful to limit sampling in a digital system to certain significant phase angles of the input signal, for example to maximize signal-to-noise ratio of data points. Known methods of limiting sampling to specific phase angle values require the controller to generate the excitation signal, or require a relatively short sampling period compared to the reference signal period. Granting the excitation signal is not always feasible, and short sampling periods require additional processing time and memory utilization, particularly when the difference between desired sampling phases is non-uniform or certain phase angles are to be rejected.

SUMMARY OF THE INVENTION

Disclosed is a method for synchronizing sampling to sinusoidally excited signals having the steps of: A) receiving a sinusoidal input; B) sampling the sinusoidal input at a current sample point having a phase angle; C) determining a phase error value of the current sample point relative to an estimated phase angle; D) determining a delay time period for converging the next sample point to the next desired estimated phase angle based on the phase error value; E) delaying obtaining the next sample until the delay time period has elapsed; and F) repeating steps B-E, thereby converging an actual sampled phase angle to a desired phase angle for the sinusoidal input.

Also disclosed is an electrical controller having: an input operable to receive a sinusoidal input signal; and a signal sampling module operable to cause the controller to perform the steps of: A) sampling the sinusoidal input at a current sample point having a phase angle; B) determining a phase error value of the current sample point relative to an estimated phase angle; C) determining a delay time period for converging the next sample point to the next desired estimated phase angle based on the phase error value; D) delaying obtaining the next sample until the delay time period has elapsed; and E) repeating steps A-D, and thereby converging an actual sampled phase angle to the desired phase angle for the sinusoidal input.

These and other features of the present invention can be best understood from the following specification and drawings, the following of which is a brief description.

DETAILED DESCRIPTION

Figure 1:
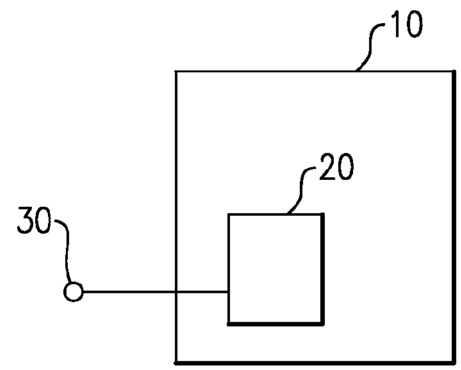
FIG. 1 illustrates an electric controller.

FIG. 1 illustrates an electric controller 10 that has a signal sampling module 20 for sampling sinusoidal signals received at a signal input 30. The signal sampling module 20 can be an electric circuit constructed of physical components, a software module, or a software-controlled hardware component, and performs a phase angle based sampling process that is described in detail below. The phase angle based sampling process allows the sample points of the signal to converge to desired sample point phase angles, regardless of the time period between each of the desired sample phase angles without requiring the controller to generate the excitation carrier signal or oversampling of the input signal. When the signal sampling module 20 is a software module, the software is stored on a tangible memory contained within the controller 10.

Figure 2:
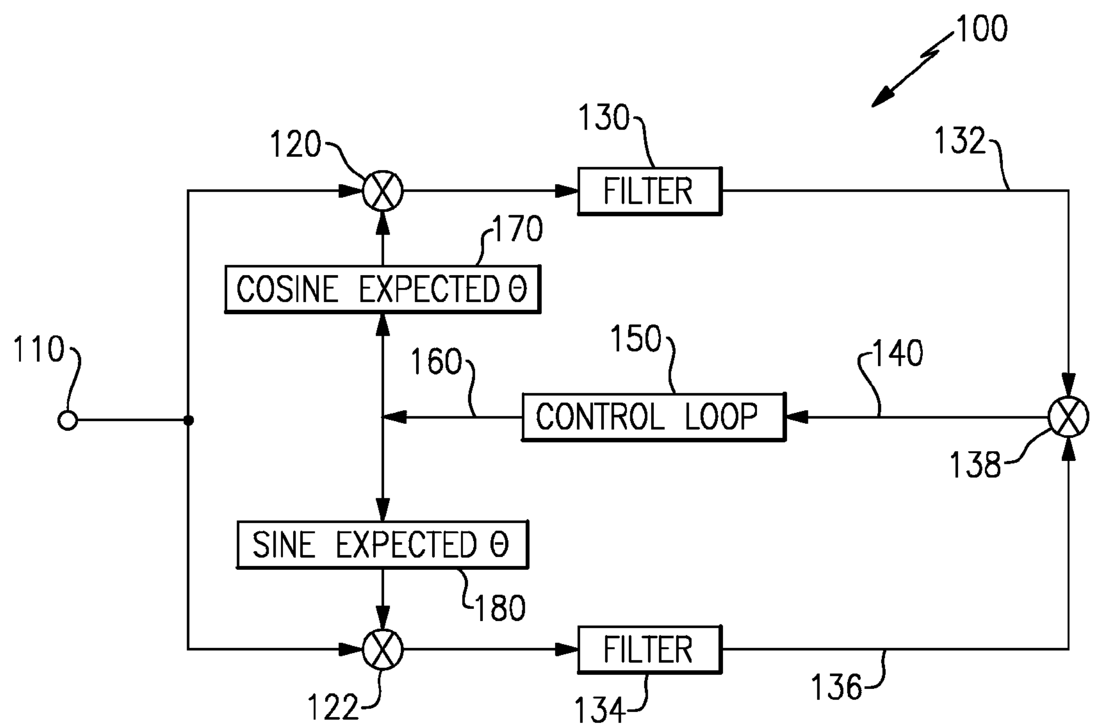
FIG. 2 illustrates a control loop utilizing a Costas loop.

FIG. 2 illustrates an example control loop 100 for use in the signal sampling module 20 described above, with regards to FIG. 1. The control loop 100 accepts a sinusoidal signal sample point at sinusoidal signal input 110. The sinusoidal signal has a general form of Sin(Φ) where $(\Phi)=\omega*t+\phi$. The signal sample point is sent to a top multiplier junction 120 and a bottom multiplier junction 122. The top multiplier junction 120 multiplies the sample point by a cosine of the estimated phase angle $(\Theta=\omega_{est}*t+\theta_{est})$ of the sample point. From the laws of trigonometry, this product is equal to the sum of a sine wave with argument (Φ+Θ) and a sine wave with argument (Φ−Θ). The resulting value is passed through a low pass filter 130 to generate a partial error value 132. For an appropriately selected filter cut-off frequency and reasonably close ω and $\omega_{est}$ values, this filter leaves only the sin(Φ−Θ) term.

Similarly, the bottom multiplier junction 122 multiplies the input sample point by a Sine of the estimated phase angle (Θ) of the sample point. The resulting value is passed through a second low pass filter 134, to generate a second partial error value 136 proportional to the cosine of (Φ−Θ). The two partial error values 132, 136 are merged in a multiplier junction 138 to create an error value 140; from the laws of trigonometry, this term is proportional to the sine of a term proportional to (Φ−Θ). If this error term is relatively small, it can be approximated by its first order series expansion (by a term directly proportional to (Φ−Θ)). The phase error value 140 is passed to a control loop 150. The control loop 150 determines an appropriate time delay for the controller 10 to wait before taking the next sample point in order to achieve a next sample point having the next desired phase angle (Θ). The control logic 150 similarly outputs an estimated phase angle (Θ) 160 for the next sample point. The controller 10 then repeats the process with the next sample point.

As the control loop 100 reiterates, the difference between the estimated phase angle and the actual phase angle of the sample point decreases resulting in a decrease in the phase error value 140. Thus, the system converges on a desired phase angle for each of the sampling points. Once the error value has reached approximately zero, the desired phase angles are locked on and the error value will maintain at approximately zero for the duration of sampling. While the illustrated control loop 100 is a Costas loop, it is understood that the present disclosure can be applied to any type of control loop and achieve the same benefits.

By incorporating control logic capable of determining a time period to delay sampling before taking a next sample point, the controller 10 is able to poll a sinusoidal signal 110 at any desired phase angles without requiring that the input signal 30 be excited by an additional carrier signal generated by the controller 10 and without requiring oversampling of the signal.

Figure 3:
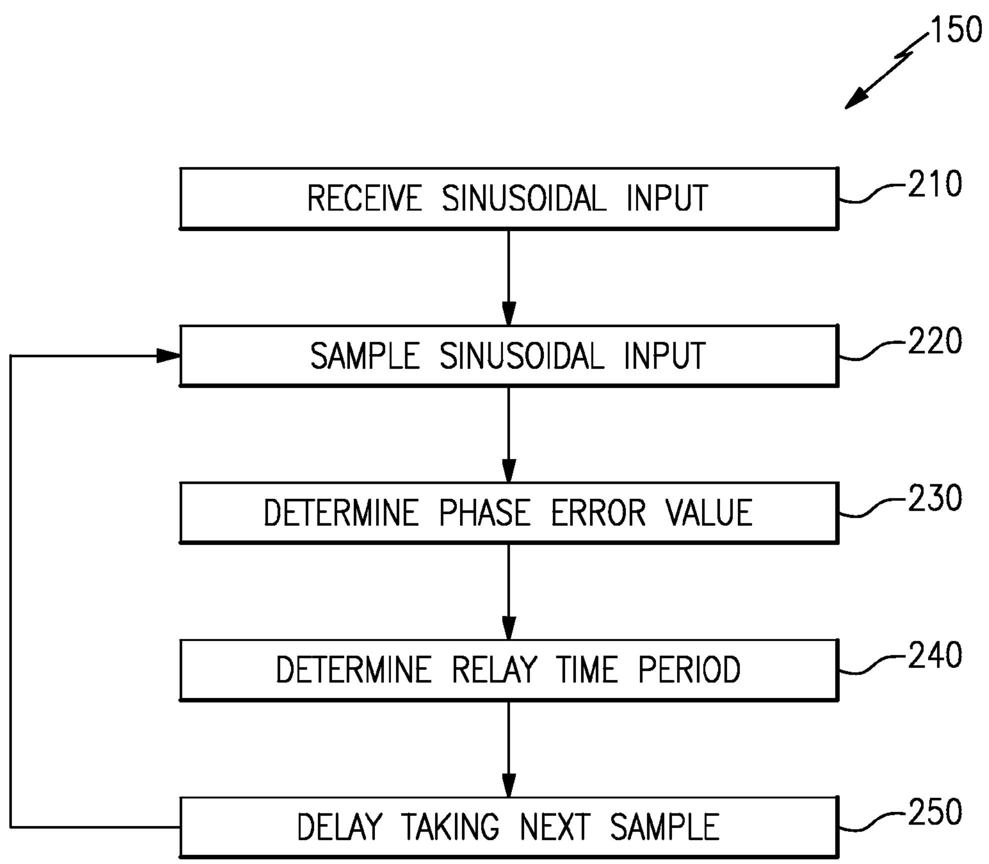
FIG. 3 illustrates a flowchart of a method for synchronizing sampling to sinusoidal signals.

FIG. 3 illustrates a flow chart demonstrating the control logic 150. Initially, the signal sampling module 20 (illustrated in FIG. 1) receives the sinusoidal input, in a "receive sinusoidal input" step 210. The signal sampling module 20, then samples the sinusoidal input to get a current sample point in a "sample sinusoidal input" step 220.

Once a current sample point is established, the control loop 100 determines a phase error value 140 of the current sampling point in a "determine phase error value" step 230. The phase error value 140 is a value that corresponds to the difference between the actual phase angle of the current sample point and the estimated phase angle of the current sample point. As described above, with regards to FIG. 2, the phase error value 140 is a combination of two partial error values 132, 136. Using a determined phase angle and the phase error value 140, a first order control loop is able to determine an estimated phase angle of the next sampling point in a system with a fixed time period between samples using the equation: $\Theta(n+1)=\Theta(n)+\alpha*error(n)$, where $\Theta(n+1)$ is the estimated phase angle of the next sampling point, $\Theta(n)$ is the estimated phase angle of the current sampling point, error(n) is the phase error value 140, and $\alpha$ is a scaling constant. In light of the present disclosure, the scaling constant $\alpha$ can be determined by one having skill in the art using known techniques, e.g. frequency-domain analysis.

If, instead, a second order pair of equations is utilized, the frequency of the input sinusoid at the sampling point can also be determined. For a system with a fixed sampling frequency, the second order pair of equations takes the form of $\Theta(n+1)=\Theta(n)+\alpha*error(n)+F(n)$, and $F(n+1)=F(n)+\beta*error(n)$, where $\Theta(n+1)$ is the estimated phase angle of the next sampling point, $\Theta(n)$ is the estimated phase angle of the current sampling point, error(n) is the phase error value 140 for the current sampling point, F(n) is the estimated frequency of the input sinusoid at the sampling point, F(n+1) is the estimated frequency of the input sinusoid at the next sampling point after being corrected for the current phase error, and $\alpha$ and $\beta$ are scaling constants. As above, in light of the present disclosure, the scaling constants $\alpha$ and $\beta$ can be determined by one of skill in the art using known techniques to ensure convergence and stability. Initial values for F(0) and $\Theta$(0) can also be determined by one of skill in the art.

The controller 10 uses the relationship illustrated in the above described second order pair of equations to then determine a delay time period for converging a next sample point to a next desired phase angle in the "determine delay time period" step 240 by modifying the equations to include a variable time period. Modifying the above equations to allow a variable time period between sampling points results in a second order pair of equations that take the form of: $\Theta(T+dt)=\Theta(T)+\alpha*error(T)+F(T)*dt$ and $F(T+dt)=F(T)+\beta*error(T)$, where $\Theta(T+dt)$ is the estimated phase angle of a sample point after a time delay of dt seconds, $\Theta(T)$ is the estimated phase angle of the current sample point, error(T) is the error value of the current sample point, F(T) is the frequency of the input sinusoid at the current sample point, dt is the time delay between sample points, and $\alpha$ and $\beta$ are scaling constants that determine the rate of convergence for estimated phase and frequency.

Using the relationships between the modified second order pair of equations, a third equation for determining the estimated time delay necessary to achieve a next sample point having a desired phase angle can be derived and takes the form of: $dt=(d\Theta-\alpha*error(T))/F(T)$, where $d\Theta$ is the desired change in phase angle from the phase angle of the current sample point to the phase angle of the next desired sample point. As each of $d\Theta$, error(T), and F(T) are either known or determinable, the controller 10 can determine the time delay (dt) required for converging a next sample point to a next desired phase angle based on the phase error value 140. The equation for computing the new frequency remains $F(T+dt)=F(T)+\beta*error(T)$. Furthermore, additional modifications may be desired for the low-pass filters 130 and 134 (or their equivalent, depending on the method used to compute the phase error value 140), such as allowing a wider passband than in traditional Costas loops to accommodate changes in sampling time over the full range of desired lock-on frequencies.

Utilization of this relationship allows the controller 10 to only sample the input sinusoid at desired phase angles, and does not require a controller generated excitation carrier signal. Furthermore, the above described second order pair of equations allows the signal sampling module 20 to use non-uniform phase distributions for the sampling points. By way of example, the controller 10 can be designed to sample an input sinusoid at 30 degree increments but omit zero crossings, resulting in sampling points at 30, 60, 120, 150, 210, 240, 300, and 330 degrees. Notably, the phase difference between each phase angle and the next desired sampled phase angle in the sequence is non-uniform as 90, 180, 270 and 360 degrees are skipped. Alternatively, the phase difference between samples could be fixed at 90 degrees. This trivializes the computation of 120 and 122 as the sine and cosine terms 170 and 180 would be limited to values of 0, 1, and −1. These sequences are non-limiting examples, and any sequence of desired phase angles could be utilized.

Once the necessary delay has been determined in the determine delay time period step 240, the controller 10 delays obtaining the next sample until the time period has elapsed in a "delay taking next sample" step 250. Once the delay time has elapsed, the signal sampling module 20 samples the sinusoid input in the "sample sinusoid input step" 220, and the process reiterates.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A method for synchronizing input sampling to desired phases of sinusoidal signals comprising the steps of:

A) receiving a sinusoidal input;

B) sampling the sinusoidal input at a current sample point having a phase angle;

C) determining a phase error value of the current sample point relative to an estimated phase angle;

D) determining a delay time period for converging a next sample point to a next desired phase angle based on said phase error value;

E) delaying obtaining the next sample until said delay time period has elapsed; and F) repeating steps B-E, and thereby converging an actual sampled phase angle to the desired phase angle for the sinusoidal input.

2. The method of claim 1, wherein said received sinusoidal input has a stable frequency.

3. The method of claim 1, wherein said phase error value corresponds to a phase difference between said phase angle of said current sample point and a desired phase angle of said current sample point.

4. The method of claim 1, wherein said delay time period is dependent on a relationship between a difference between a desired phase angle of the current sample point and the next sample point subtracted by the phase error multiplied by a scaling factor, and an estimated frequency of the sinusoidal input.

5. The method of claim 4, wherein said relationship is the difference between the desired phase angle of the current sample point and the next sample point subtracted by the phase error multiplied by the scaling factor, all of which is divided by the estimated frequency of the sinusoidal input.

6. The method of claim 4, wherein the difference between a desired phase angle of the current sample point and the next sample point is not constant for all iterations of the method.

7. The method of claim 1, wherein said determined delay time period is not constant for all iterations of the method.

8. An electrical controller comprising:

an input operable to receive a sinusoidal input signal; and a phase lock module operable to cause the controller to perform the steps of:

A) sampling the sinusoidal input at a current sample point having a phase angle;

B) determining a phase error value of the current sample point relative to an estimated phase angle;

C) determining a delay time period for converging a next sample point to a next desired phase angle based on said phase error value;

D) delaying obtaining the next sample until said delay time period has elapsed; and E) repeating steps A-D, and thereby converging an actual sample phase angle to the desired phase angle for the sinusoidal input.

9. The electrical controller of claim 8, wherein said phase lock module is a hardware-based electric circuit.

10. The electrical controller of claim 8, further comprising a tangible memory component, and wherein said phase lock module is a software module stored within said tangible memory component.

* * * * *